May 3, 1966
R. P. MASSEY
3,249,894
REGULATED CONVERTER CIRCUIT EMPLOYING
A HIGH GAIN FEEDBACK LOOP
Filed Dec. 16, 1963
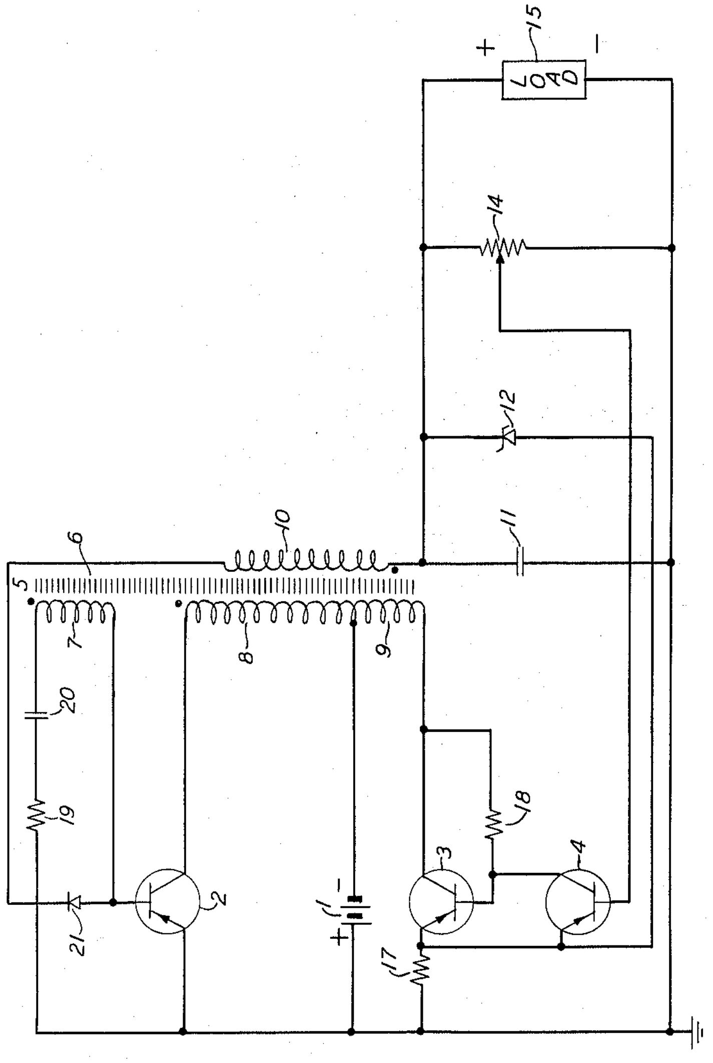
INVENTOR
R. P. MASSEY
BY R. B. Ardis
ATTORNEY 3,249,894
Patented May 3, 1966

3,249,894

REGULATED CONVERTER CIRCUIT EMPLOYING A HIGH GAIN FEEDBACK LOOP

Richard P. Massey, Westfield, N.J., assignor to Bell Telephone Laboratories, Incorporated, New York, N.Y., a corporation of New York Filed Dec. 16, 1963, Ser. No. 330,946
8 Claims. (Cl. 331—113)

This invention relates to voltage conversion circuits and more particularly to conversion circuits employing a high gain feedback loop.

In converters, as well as in regulators, it is generally desired to work into a capacitive output filter rather than an inductive output filter. Capacitive output filters possess the advantages of smaller size, lower cost, and higher voltage capacity in readily available commercial units. Despite these advantages, the tendency of capacitive filters to follow the peak load voltage, and hence cause the filter voltage to vary widely with small load voltage variations, have destroyed their usefulness for most applications. The reason for this is apparent once it is remembered that the usual closed loop error detecting feedback networks, which have only nominal gain, are essentially nonresponsive to peak filter voltage variations. Filter voltage variations thus appear cross the load as noise and inhibit the noise and regulation factors (figures of merit) of the over-all circuit to the point where the converter-regulator circuit is unsatisfactory for most commercial applications. The mute testimony to this disadvantage is readily seen from the all but universal use of voltage-averaging inductive filters in regulator and converter circuits despite the increased cost, size, and in some instances, limited commercial availability of these components. The inductive output filter averages the load voltage rather than follow the peak load variations as in the case of the capacitive filter, and because of this averaging ability, is inherently insensitive to small changes in the load.

Attempts at solving the capacitive filter problem by providing high gain feedback loops to compensate for small voltage variations have met with the new problem of distinguishing the parasitic circuit noise which, due to the high gain, is amplified to the point where it is indistinguishable from the feed-back error or correction signal. Attempts at a solution to the problem were found in circuits which required a large number of components to distinguish and eliminate the noise from the error signal, The excess number of components required by such circuits, however, outweighs the initial advantages noted heretofore that are obtained by the use of a capacitive filter rather than an inductive filter.

It is, therefore, an object of this invention to provide a converter configuration which works into a capacitive output filter without reducing the noise and regulation factors of the converter.

A closely related object is to do so with an effectively high gain closed feedback loop which responds to peak filter voltage variations and employs a minimum number of components.

The present invention employs an emitter coupled multivibrator (Schmitt trigger) circuit in an inverter configuration with a capacitive output filter to provide a high gain, noise free feedback loop. The normally conductive transistor of the multivibrator functions as one of the inverter transistors and, in the usual inverter fashion, conducts in alternation with the other inverter transistor to supply current from a source of direct voltage to the primary winding of the inverter transformer in respectively opposite directions. The normally nonconductive transistor of the multivibrator is connected with a reference potential to the load and is biased into conduction each time the load potential exceeds the reference potential. Since the normally conductive transistor of the multivibrator which, as noted, also serves as an inverter transistor, is rendered nonconductive by conduction of the normally nonconductive transistor, the current flow from the direct voltage source through the primary winding will be interrupted. Interrupting the current flow in the primary winding will thus compensate for an increase in load voltage and effectively provide a high gain feedback loop which is capable of compensating for capacitive filter load voltage variations.

The nature of the invention and its distinguishing features and advantages will be more clearly understood from the detailed description and the accompanying drawing, the single figure of which is a schematic embodiment of the invention.

For purposes of illustration, the present invention is explained with, although clearly not restricted to, the asymmetric converter circuit illustrated in the drawing. Briefly, asymmetric converters are structurally similar to symmetric converters and, like many symmetric converters, may use a saturable transformer to control the switching action of the transistors. Unlike the symmetric converters, however, only one transistor of the asymmetric converter supplies power to the load; the other, lower power rated transistor serves only to reset the saturable transformer core without supplying any power to the load. Since the turns ratio of the saturable transformer may be adjusted so that the higher power capacity transistor conducts for a longer period of time than the lower power core reset transistor, the circuit is called an asymmetric circuit as opposed to a symmetric circuit wherein both transistors conduct for equal intervals of time and both supply power to the load. Usually, asymmetric converters have a half wave rectifier inserted between the transformer secondary winding and the load to isolate the load from the source during the periods the core reset transistor is conducting. In the asymmetric converter embodiment of the present invention, the normally conductive transistor of the multivibrator (Schmitt trigger), in addition to providing the regulating function, also provides the core reset function.

As can be seen from the drawing, the collector-emitter path of the pnp transistor 2 is serially connected with the winding portion 8 and the direct voltage input source 1. Resistor 17 and the emitter-collector path of pnp transistor 3 are serially connected with the winding portion 9 and the direct-current input source 1. Since the circuit is an asymmetric converter, pnp transistor 2 may have a higher current capacity than core reset and multivibrator (Schmitt trigger) transistor 3 which need have only a relatively low power capacity. Resistor 18 connects the base electrode of transistor 3 to the end terminal of winding portion 9. Resistor 19, capacitor 20, and winding 7 are serially connected with the emitter-base path of transistor 2. The emitter-collector path of pnp transistor 4 is connected across the emitter-base path of transistor 3. The positive terminal of the direct voltage input source 1 and the negative terminal of the load 15 are connected to ground. Diode 21 is serially connected in the forward conductivity direction from the base electrode of transistor 2 to secondary winding 10, the other (dotted) terminal of which is connected to the positive terminal of the load 15. Windings 7, 8–9, and 10 are wound on the saturable core (rectangular BH loop) 6 of transformer 5. Capacitive filter 11 is connected across the load 15 as is potentiometer 14, the wiper arm of which is connected to the base electrode of transistor 4. Zener diode 12 is connected from the positive terminal of the load 15 to the emitter electrode of transistor 4 in the inverse or zener direction.

Unlike the usual symmetric converters wherein both transistors conduct for equal intervals of time, the turns ratio of the asymmetric converter transformer may be adjusted to allow the power transistor 2 to conduct for a longer interval of time than the core reset transistor 3, thus extending the power output of the converter. As can be seen from the relative turns ratio indicated in the drawing, the power transistor 2 will conduct for a longer interval of time than the core reset transistor 3.

The operation of the circuit is most easily understood by assuming that transistor 2 is conducting while transistor 3 is cut-off or nonconductive. Current flows from the positive terminal of the direct-current source 1, through the emitter-collector path of transistor 2, through winding portion 8, and back to the negative terminal of the source 1. As can be seen from the relative polarities of the induced potentials indicated by the dots, the potential induced in winding 7 drives transistor 2 further into conduction, which causes more emitter-collector current flow in transistor 2, and hence greater induced potentials in winding 7 in typical regenerative fashion. This process continues until sufficient volt-second energy is supplied via winding portion 8 to saturate the saturable core 6. When sufficient energy is supplied to the core 6, there is no longer any change of flux in the core and, due to the absence of a change of flux, there is no longer any potential induced in winding 7. Since there is no longer any forward bias being supplied by winding 7, transistor 2 ceases to conduct, the flux surrounding transformer 5 collapses, and a potential opposite to the previous forward bias potential is induced in winding 7 to drive transistor 2 into cut-off. In the manner discussed hereinafter, transistor 2 remains cut off until sufficient volt-second energy is supplied to transformer 5 to once again saturate the core 6, whereupon this latter flux collapses, transistor 2 is once again biased into conduction, and the initial regenerative cycle repeats itself.

As noted, winding 7 provides voltage feedback to transistor 2 during both the conductive and nonconductive intervals of transistor 2. In addition to this voltage feedback, current feedback is also provided. This combination of current and voltage feedback obtains most of the advantages of both types of feedback while eliminating most of the disadvantages of each, as discussed in detail, for example, in United States Patent 3,078,422, J. K. Mills, issued February 19, 1963. For present purposes, it appears sufficient to note that diode 21 provides both current feedback and the necessary half-wave isolation or rectification in the present asymmetric circuit. The current feedback path may be traced from the negative terminal of the load 15, through the emitter-base path of transistor 2, through forward-biased diode 21, through secondary winding 10, and back to the positive terminal of the load 15. As can be seen from the relative polarities of the induced potentials indicated by the dots, secondary winding 10 will cause diode 21 to be forward biased during the conductive interval of transistor 2 and back-biased during the nonconductive interval of transistor 2. During the nonconductive interval of transistor 2, the back-bias applied to diode 21 serves to isolate the input or power circuit from the output or load circuit during the core reset interval which, as discussed heretofore, is the usual arrangement in an asymmetric converter.

Closed loop regulation is achieved by the error detecting, amplifying, regulating, and core reset function network which comprises transistors 3 and 4. Transistor 4 compares the constant potential of zener diode 12 with the portion of the load potential appearing across the upper portion of potentiometer 14. When that portion of the load potential which is being supplied via potentiometer 14 rises above the constant reference or zener voltage appearing across diode 12, transistor 4 is biased into conduction which, as discussed in detail hereinafter, causes transistor 3 to cut-off in typical Schmitt trigger fashion. During the normal nonconductive interval of transistor 4, transistor 3 conducts in the class A mode of operation due to the quiescent bias supplied by the potential of the source via resistors 17 and 18. As noted heretofore, however, transistor 3 must be nonconductive during the conductive interval of transistor 2 for the necessary push-pull or oscillator switching operation of the circuit. The circuit comprising transistors 3 and 4 accomplishes this and simultaneously achieves the regulating function, without the necessity for additional circuit components, in the following manner.

The regulating action is best seen by assuming that after several starting cycles of oscillation, transistor 2 is initially being biased from cut-off into conduction so that the regenerative process described heretofore in connection with that transistor is just beginning. The potential across capacitive filter 11, which supplies energy to the load during the nonconductive interval of transistor 2, has decreased to the point where its potential is now somewhere below the predetermined load potential. At the instant transistor 2 is biased into conduction, the voltage induced in secondary winding 10 again very quickly, due to the low impedance of the charge path, charges capacitive filter 11 to a potential greater than the predetermined load potential. The potential appearing across capacitive filter 11, and hence the load 15, thus quickly exceeds the predetermined or desired load potential and the zener point of diode 12, and thus biases transistor 4 into conduction almost simultaneously with conduction through transistor 2. The magnitude of the instant charge voltage to capacitive filter 11 is sufficient to bias transistor 4 almost immediately into saturation. Since the collector-emitter voltage drop of a transistor in saturation is essentially zero, the collector-emitter path of transistor 4 effectively shorts the base-emitter path of transistor 3, thereby causing this latter transistor to be driven to a point on the verge of cut-off. The time lag between the initiation of conduction in transistor 2 and the termination of conduction in transistor 3 has been found experimentally to be relatively short. Since the tendency of the potential being induced in winding 10 during the conduction interval of transistor 2 is to further increase the charge on capacitor 11, transistor 3 is held essentially cut-off during the entire conductive interval of transistor 2. As discussed heretofore, when sufficient volt-second energy is supplied to the core 6 of transformer 5, the core saturates, the flux in transformer 5 collapses, and diode 21 is back-biased by the potential now induced in winding 10, thereby opening the charge path of capacitor 11 during the nonconductive interval of transistor 2. As discussed hereinafter, transistors 3 and 4, in addition to supplying the necessary core reset function for the push-pull mode of operation, also provide the error detecting, amplifying, regulating, and core reset functions in this closed loop circuit.

As noted heretofore, during the nonconductive interval of transistor 2 the load voltage falls slightly below the predetermined potential. Due to the gradual discharge of capacitor 11 below the predetermined load potential, transistor 4 is cut off, and transistor 3 is biased into the class A mode of operation by the quiescent current supplied via resistors 17 and 18. Transistor 3 will thus remain conductive until sufficient volt-second energy is applied to the saturable core 6 via winding 9 to saturate the core in the opposite direction on the BH characteristic to the direction when transistor 2 was conducting. As noted heretofore in the description of the oscillatory operation of the circuit, the length of time it takes the saturable core 6 of transformer 5 to saturate in one direction is determined by the volt-second energy supplied to the core 6 via winding portion 9. It is readily seen therefore, that decreasing the voltage drop across the emitter-collector path of transistor 3 will increase the voltage appearing across winding portion 9, and thus decrease the time required to saturate the core 6. Since this latter time determines the duration of the conductive interval of transistor 3 this interval will also decrease. Conversely, if the voltage across the emitter-collector path of transistor 3 were to increase, the voltage across winding portion 9 would decrease, and the length of the conduction interval of transistor 3 would increase. Since no power is supplied to the load during the conductive interval of transistor 3, closed loop voltage regulation is readily obtained by controlling the emitter-collector voltage drop of transistor 3 and relying on the inherent regulating property of the saturable core 6 (i.e., the fixed volt-second energy requirement to saturate the core in each direction).

If it is assumed that during the conduction interval of transistor 3 the load voltage were to suddenly increase, as for example, due to a change of load, transistor 4 would be immediately biased into saturation and cause transistor 3 to be biased to the verge of cut-off, even though transistor 2 is not conducting. The collector-emitter path of transistor 3 when on the verge of cut-off appears, for all practical purposes, as an open circuit with essentially all the voltage in the loop comprising winding 9 appearing across this collector-emitter open circuit. Since the voltage across winding 9 has decreased, the time required for the core 6 to saturate in the opposite direction must increase. The interval wherein no power is supplied to the load is thus increased, thereby compensating for the assumption of an increase in load potential. Since the low impedance charge path for capacitor 11 quickly compensates for decreases in load voltage, it is not necessary to provide further compensation for this event. If the load voltage were to decrease during the conduction interval of transistor 3, core reset transistor 3 would continue to operate at its class A quiescent point as a fixed impedance until the core 6 saturated. Transistor 2 would then quickly compensate for the assumed load voltage decrease during its conduction interval, as discussed heretofore.

In summary then, an increase of load voltage causes transistor 4 to be driven into saturation which, in turn, drives transistor 3 essentially into cut-off and increases the nonconduction interval of transistor 2. Since transistor 3 is driven to the extreme condition of being on the verge of cut-off, the regulating circuitry effectively obtains a high gain closed feedback loop without the problem of such a loop, i.e., parasitic noise amplification. The present invention therefore obtains all the advantages of a high gain loop with none of the disadvantages and makes possible the use of a capacitive output filter. As noted heretofore, the capacitive output filter is desired because of its small size, economy, and commercial availability.

It should be noted that in the illustrated embodiment of the invention polarity reversal between the input source 1 and the load 15 is obtained, i.e., the positive terminal of the source 1 and the negative terminal of the load 15 are interconnected to ground. If polarity reversal were not desired, inexpensive npn transistors, connected as a Schmitt trigger circuit, could be substituted for the more expensive pnp transistors illustrated, merely by reversing the relative biasing polarities.

The present circuit may be modified so that a conventional linear error-detector drives a Schmitt trigger which, in turn, would control the core reset transistor in a manner similar to the present circuit. The present invention eliminates the multiplicity of components in such a circuit however, and, as discussed, combines the core reset, regulating, amplifying, and error detecting functions into two transistors. There is also an associated saving of a biasing network for the core reset transistor since the regulating network inherently controls the switching action of the core reset transistor.

The above-described arrangement is illustrative of the application of the principles of the invention. Other embodiments may be devised by those skilled in the art without departing from the spirit and scope of the invention.

What is claimed is:

1. An asymmetric converter circuit comprising a source of direct-current input potential, a load, a saturable transformer having a primary, secondary, and biasing winding, and first, second and third transistors, each of said first, second, and third transistors having base, collector, and emitter electrodes, means serially connecting the emitter and collector electrodes of said first transistor between said source of input potential and at least a portion of said primary winding to intermittently interrupt the current flow from said source to said load, means serially connecting the emitter and collector electrodes of said second transistor between said source of input potential and the remaining portion of said primary winding, biasing means, means connecting said biasing means between the base and collector electrodes of said second transistor to provide quiescent class A bias to said second transistor, means connecting said biasing winding between the base and emitter electrodes of said first transistor, means interconnecting the emitter electrodes of said second and third transistors, means connecting the base electrode of said second transistor to the collector electrode of said third transistor, means serially connecting the base electrode of said first transistor, said secondary winding, said load, and the emitter electrode of said first transistor, a source of constant potential, means for obtaining a portion of the potential appearing across said load, and means serially connecting said portion of the load potential and said constant potential between the base and emitter electrodes of said third transistor whereby the conduction of said third transistor and the nonconduction of said second transistor are initiated each time the load potential exceeds said constant potential.

2. An asymmetric converter circuit comprising a source of direct-current potential, a load, a saturable transformer having primary, secondary, and biasing windings, first, second, and third transistors each having base, collector and emitter electrodes, said first transistor having a higher emitter-collector current capacity than said second and third transistors, first and second resistors, a diode, a zener diode, a filter capacitor, a potentiometer, means for serially connecting said source of input potential, the emitter and collector electrodes of said first transistor, and at least a portion of said primary winding, means for connecting said biasing winding across the base and emitter electrodes of said first transistor, means for serially connecting said source of input potential, said first resistor, the emitter and collector electrodes of said second transistor, and the remaining portion of said primary winding, means connecting said second resistor between the base and collector electrodes of said second transistor, means interconnecting the emitter electrodes of said second and third transistors, means connecting the base electrode of said second transistor to the collector electrode of said third transistor, means serially connecting the base electrode of said first transistor, said second diode poled in the forward conductivity direction, said secondary winding, said load, and the emitter electrode of said first transistor, means for connecting said filter capacitor across said load, means for connecting said potentiometer across said load, means connecting said zener diode in the zener direction from the juncture of said secondary winding and said load to the emitter electrodes of said second and third transistors, and means connecting the base electrode of said third transistor to the wiper arm of said potentiometer whereby said third transistor is rendered conductive each time the load potential exceeds the zener potential of said zener diode.

3. An inverter circuit comprising a source of direct voltage, a transformer having a primary winding and at least one secondary winding, a load, first, second, and third transistors having base, collector, and emitter electrodes, said first and second transistors having their emitter and collector electrodes serially connected with said source of direct voltage and first and second portions, respectively, of said primary winding, first biasing means connected to the base and emitter electrodes of said fisrt transistor to provide bias sufficient to sustain intermittent current flow through the emitter and collector electrodes of said first transistor from said source of direct voltage through said first portion of said primary winding, said first transistor being conductive for predetermined intrevals unaffected by the voltage across said load, second biasing means connected to the base and emitter electrodes of said second transistor to provide sufficient bias to sustain current flow through the emitter and collector electrodes of said second transistor from said source of direct voltage through said second portion of said primary winding, means connecting said secondary winding to said load to supply substantially all of the potential induced in said secondary winding to said load, means connecting the base and emitter electrodes of said third transistor to said load, and means connecting the collector and emitter electrodes of said third transistor to the base and emitter electrodes, respectively, of said second transistor to control the state of conductivity of said second transistor in accordance with the magnitude of the voltage appearing across said load.

4. An inverter circuit comprising a source of direct voltage, a transformer having a primary winding and at least one secondary winding, a load, first and second transistors having base, collector, and emitter electrodes, means connecting the emitter and base electrodes of said first transistor with the emitter and collector electrodes, respectively, of said second transistor in an emitter coupled multivibrator circuit, said first transistor being normally conductive while said second transistor is normally nonconductive, a third transistor also having base, collector, and emitter electrodes, means connecting said emitter and collector electrodes of said first and third transistors with said source of direct voltage and first and second portions, respectively, of said primary winding, first biasing means connected to the base and emitter electrodes of said third transistor to provide bias sufficient to sustain intermittent current flow through the emitter and collector electrodes of said third transistor from said source of direct voltage through said first portion of said primary winding, said third transistor being conductive for predetermined intervals unaffected by voltage variations across said load, means connecting said secondary winding to said load to supply substantially all the potential induced in said secondary winding to said load, and means connecting the base and emitter electrodes of said second transistor to said load so that said second transistor is rendered conductive and said first transistor nonconductive whenever the voltage across said load exceeds a predetermined magnitude, whereby the current through said second portion of said primary winding is interrupted to compensate for an increase in load voltage above said predetermined magnitude.

5. An inverter circuit in accordance with claim 4 wherein a capacitive output filter is connected across said load in a substantially impedance free charging path with respect to said secondary winding to quickly charge said capacitive filter during the predetermined conduction interval of said third transistor to a potential greater than said predetermined magnitude whereby said second transistor is rendered conductive and said first transistor essentially nonconductive during the conductive intervals of said third transistor.

6. An asymmetric inverter circuit comprising a source of direct-current input potential, a load, a saturable transformer having at least a primary and secondary winding, first, second, and third transistors each having base, collector, and emitter electrodes, means serially connecting the collector and emitter electrodes of said first and second transistors between said source of input potential and first and second portions, respectively, of said primary winding, first biasing means connected to the base and emitter electrodes of said first transistor to provide bias sufficient to sustain intermittent current flow through the emitter and collector electrodes of said first transistor from said source of input potential through said first portion of said primary winding, said first transistor being conductive for predetermined intervals unaffected by variations in voltage across said load, second biasing means connected to the base and emitter electrodes of said second transistor to provide sufficient bias to sustain current flow through the collector and emitter electrodes of said second transistor from said source of input potential through said second portion of said primary winding, means connecting said secondary winding to said load to supply substantially all the potential induced in said secondary winding to said load, means connecting the base and emitter electrodes of said third transistor to said load to render said third transistor conductive when the voltage across said load exceeds a predetermined magnitude, and means connecting the collector and emitter electrodes of said third transistor to the base and emitter electrodes, respectively, of said second transistor such that conduction in said third transistor due to the voltage across said load rising above said predetermined magnitude will cause said second transistor to become nonconductive and interrupt the current flow through said second portion of said primary winding to thereby regulate the voltage appearing across said load.

7. An asymmetric converter in accordance with claim 6 wherein a source of constant potential is connected between the emitter electrode of said third transistor and said load whereby conduction of said third transistor is initiated when the voltage across said load exceeds said constant potential.

8. An asymmetric converter in accordance with claim 6 wherein a capacitive output filter is connected across said load in a substantially impedance-free path whereby the potential across said capacitor quickly charges to a value greater than the predetermined load potential to initiate conduction in said third transistor simultaneously with conduction through said first transistor.

References Cited by the Examiner

UNITED STATES PATENTS

| | | | |
|---|---|---|---|
| 2,950,446 | 8/1960 | Humez et al. | 331—113.1 |
| 2,959,745 | 11/1960 | Grieg | 331—113.1 |
| 2,968,738 | 1/1961 | Pintell | 331—113.1 |
| 3,067,378 | 12/1962 | Paynter | 331—113.1 |
| 3,117,270 | 1/1964 | Tailleur | 331—113.1 |

NATHAN KAUFMAN, *Acting Primary Examiner.*

JOHN KOMINSKI, *Examiner.*